(12) United States Patent
Xue

(10) Patent No.: US 8,853,003 B2
(45) Date of Patent: Oct. 7, 2014

(54) WAFER LEVEL CHIP SCALE PACKAGE WITH THICK BOTTOM METAL EXPOSED AND PREPARATION METHOD THEREOF

(75) Inventor: Yan Xun Xue, Los Gatos, CA (US)

(73) Assignee: Alpha & Omega Semiconductor, Inc., Sunnyvale, CA (US)

(*) Notice: Subject to any disclaimer, the term of this patent is extended or adjusted under 35 U.S.C. 154(b) by 228 days.

(21) Appl. No.: 13/602,144

(22) Filed: Sep. 1, 2012

(65) Prior Publication Data
US 2013/0037917 A1 Feb. 14, 2013

Related U.S. Application Data

(63) Continuation-in-part of application No. 13/205,864, filed on Aug. 9, 2011, now Pat. No. 8,642,385, and a continuation-in-part of application No. 13/396,531, filed on Feb. 14, 2012, and a continuation-in-part of application No. 13/429,263, filed on Mar. 23, 2012, now Pat. No. 8,710,648, and a continuation-in-part of application No. 13/547,358, filed on Jul. 12, 2012, now Pat. No. 8,563,361.

(51) Int. Cl.
| | |
|---|---|
| H01L 23/495 | (2006.01) |
| H01L 21/60 | (2006.01) |
| H01L 21/56 | (2006.01) |
| H01L 23/492 | (2006.01) |
| H01L 21/768 | (2006.01) |
| H01L 21/78 | (2006.01) |
| H01L 23/00 | (2006.01) |
| H01L 23/31 | (2006.01) |

(52) U.S. Cl.
CPC ......... *H01L 23/492* (2013.01); *H01L 2224/131* (2013.01); *H01L 2224/32245* (2013.01); *H01L 2224/11009* (2013.01); *H01L 2224/13013* (2013.01); *H01L 2224/73153* (2013.01); *H01L 21/561* (2013.01); *H01L 24/73* (2013.01); *H01L 24/32* (2013.01); *H01L 21/76898* (2013.01); *H01L 24/94* (2013.01); *H01L 24/05* (2013.01); *H01L 2224/02371* (2013.01); *H01L 2224/05025* (2013.01); *H01L 24/83* (2013.01); *H01L 24/06* (2013.01); *H01L 2924/13091* (2013.01); *H01L 2224/73104* (2013.01); *H01L 23/3114* (2013.01); *H01L 2224/13022* (2013.01); *H01L 2224/13014* (2013.01); *H01L 2224/0557* (2013.01); *H01L 2224/0401* (2013.01); *H01L 2224/05571* (2013.01); *H01L 24/11* (2013.01); *H01L 24/13* (2013.01); *H01L 2224/94* (2013.01); *H01L 21/78* (2013.01); *H01L 2224/06181* (2013.01); *H01L 2224/83005* (2013.01); *H01L 2224/04026* (2013.01)
USPC ............................................ 438/111; 257/621

(58) Field of Classification Search
CPC ....... H01L 21/561; H01L 21/78; H01L 24/94; H01L 21/76898; H01L 23/492
USPC ............ 438/111; 257/621, E23.033, E21.506
See application file for complete search history.

(56) References Cited

U.S. PATENT DOCUMENTS

| | | | |
|---|---|---|---|
| 6,107,164 A | 8/2000 | Ohuchi | |
| 2009/0032871 A1 | 2/2009 | Vervoort et al. | |
| 2012/0267787 A1* | 10/2012 | Gong | ............................ 257/773 |

OTHER PUBLICATIONS

U.S. Appl. No. 13/273,168, filed Oct. 13, 2011.

*Primary Examiner* — Walter H Swanson
(74) *Attorney, Agent, or Firm* — Chein-Hwa Tsao; C H Emily LLC

(57) ABSTRACT

A method for forming a wafer level chip scale (WLCS) package device with a thick bottom metal comprising the step of attaching a lead frame comprising a plurality of thick bottom metals onto a back metal layer of a semiconductor wafer including a plurality of semiconductor chips having a plurality of bonding pads formed on a front surface of each chip, each thick bottom metal is aligned to a central portion of each chip; a plurality of back side cutting grooves are formed along the scribe lines and filled with a package material, the package material are cut through thus forming a plurality of singulated WLCS package devices.

13 Claims, 12 Drawing Sheets

WAFER LEVEL CHIP SCALE PACKAGE WITH THICK BOTTOM METAL EXPOSED AND PREPARATION METHOD THEREOF

CROSS-REFERENCE TO RELATED APPLICATIONS

This Patent Application is a Continuation in Part (CIP) Application of a application Ser. No. 13/205,864 filed on Aug. 9, 2011 now U.S. Pat. No. 8,642,385 by a common inventor of this Application. The Disclosure made in the patent application Ser. No. 13/205,864 is hereby incorporated by reference.

This Patent Application is a Continuation in Part (CIP) Application of a co-pending application Ser. No. 13/396,531 filed on Feb. 14, 2012 by a common inventor of this Application. The Disclosure made in the patent application Ser. No. 13/396,531 is hereby incorporated by reference.

This Patent Application is a Continuation in Part (CIP) Application of a application Ser. No. 13/429,263 filed on Mar. 23, 2012 now U.S. Pat. No. 8,710,648 by a common inventor of this Application. The Disclosure made in the patent application Ser. No. 13/429,263 is hereby incorporated by reference.

This Patent Application is a Continuation in Part (CIP) Application of a application Ser. No. 13/547,358 filed on Jul. 12, 2012 now U.S. Pat. No. 8,563,361 by a common inventor of this Application. The Disclosure made in the patent application Ser. No. 13/547,358 is hereby incorporated by reference.

FIELD OF THE INVENTION

The invention generally relates to a semiconductor package and a preparation method thereof and particularly relates to a molded wafer level chip scale package (WLCSP) with a thick bottom metal exposed.

DESCRIPTION OF THE RELATED ART

In a wafer level chip scale package (WLCSP), the chips formed on a wafer are packaged and tested at wafer level, then single semiconductor packages are separated from the wafer, thus the size of the resulted package is almost equal to the size of an original chip. For power semiconductor device, it is also required that the semiconductor package has excellent heat dissipation and electric performance.

In a semiconductor package, the chip is thinned to a certain thickness to reduce the substrate resistance and the thickness of the package. However, the thinner the chip is, the easier it is to break. Therefore, different techniques are developed to prevent the chip from being broken and damaged.

US publication number 2009/0032871 discloses a wafer level packaging method, in which, a semiconductor package includes a first metal contact at the front surface of the chip, a second metal contact at the back surface of the chip, and a conductive structure located at the side surface of the chip interconnecting the first and the second metal contacts. However, the second metal contact at the back surface of the chip exposes out of the package material encapsulating the chip and the conductive structure resulting in poor moisture resistance and mechanical protection.

U.S. Pat. No. 6,107,164 also discloses a wafer level packaging method, in which, package body is formed at the front surface of the wafer; then, the wafer is thinned from the back surface of the wafer followed by a separation of single packages from the wafer, such that the back surface of the package exposing out of the package body. U.S. Pat. Nos. 6,420,244 and 6,851,607 disclose similar wafer level packaging methods. However, the semiconductor packages formed with the conventional packaging methods lack of mechanical support for thinned wafer and the thermal performance is not optimized.

BRIEF DESCRIPTION OF THE DRAWINGS

As shown in attached drawings, the embodiment of the invention is more sufficiently described. However, the attached drawings are only used for explaining and illustrating rather than limiting the scope of the invention.

DETAILED DESCRIPTION OF THE PREFERRED EMBODIMENTS

Figure 1A:
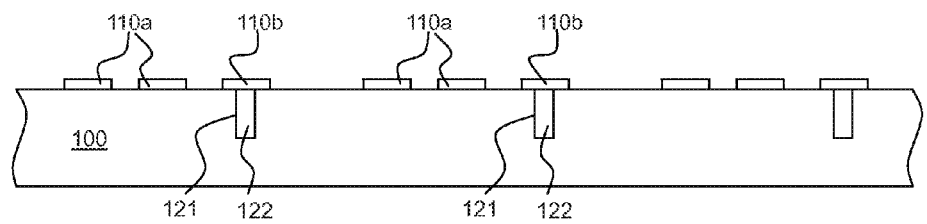
FIGS. 1A-1O are schematic diagrams illustrating a method of preparing a wafer level package device with the thick bottom metal according to an embodiment of the present invention.

As shown in FIG. 1A, a wafer 100 comprises a plurality of chips (not shown) separated from each other by a plurality of scribe lines (not shown) formed at the front surface of the wafer 100, which is well known in the art. First bonding pads 110a and second bonding pads 110b are formed at the front surface of each chip. Furthermore, through vias 121 are formed at the top portion of the wafer and aligned under the second bonding pads 110b. A thin insulation layer (not shown) is formed to cover the sidewall and bottom of each through via, then the though vias 121 are filled with a conductive material 122, thus the conductive material 122 is electrical isolated from the semiconductor material of the wafer surrounding each through via 121 and electrically connected to the corresponding second bonding pad 110b. The insulation layer may be an oxide layer with a certain thickness or a composite layer. In an embodiment, the composite layer may include a nitride layer (such as SiN) covering the side wall and the bottom of the through via 121, an oxide layer (such as $SiO_2$) covering the nitride layer, then a metal diffusion barrier layer (such as Ti, TiN, $Ti_xSi_yN_z$ or Ta, TaN, $Ta_xSi_yN_z$ or W, WN, WN2 and the like) covering the oxide layer. The conducting material 122 can be a metal such as tungsten, aluminum, copper and the like or other alloy. The nitride layer functioning as a diffusion barrier layer is used for preventing the conducting material 122 from diffusing into the conductive material in the wafer surrounding the through via 121, while oxide layer can be functioned as an electrical insulation layer, and the metal diffusion barrier layer further prevents the diffusion of conducting material 122 into the conductive material in the wafer surrounding the through via 121.

Figure 1B:
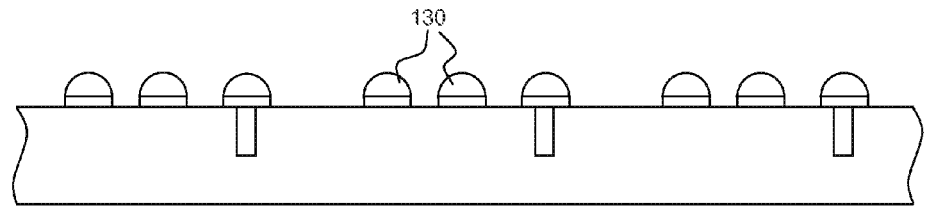
Figure 1C:
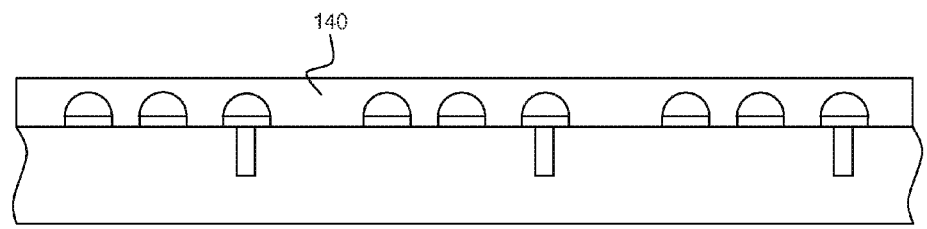
Figure 1D:
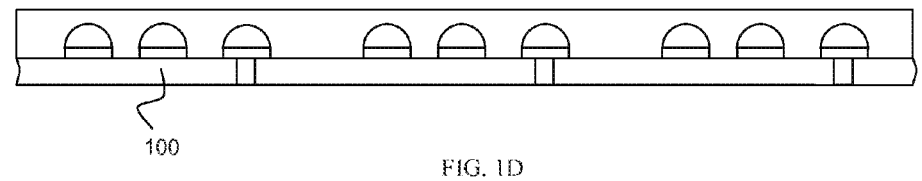
Figure 1E:
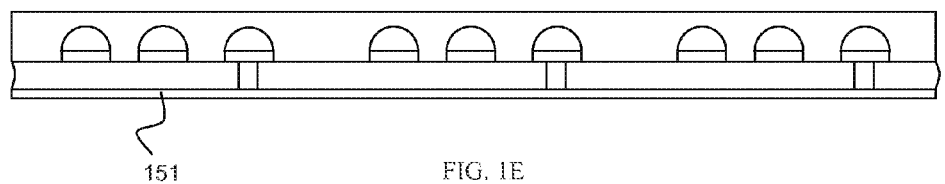

As shown in FIG. 1B, a metal interconnecting structure 130 is formed on each of the bonding pads 110a and 110b, which can be a solder ball or a metal bump in arbitrary shapes such as sphere, ellipsoid, wedge, cube, or cylinder. As shown in FIG. 1C, a front package layer 140 is deposited to cover the front surface of the wafer 100 and encapsulate the metal interconnecting structures 130, which can be an epoxy resin. The front package layer 140 provides a mechanical support for the wafer 100, as such the wafer 100 can be ground from its back surface, as shown in FIG. 1D, to a predetermined thickness until the conducting material 122 exposed from the back surface of thinned wafer 100. Then, a back metal layer 151 is deposited to cover the back surface of the thinned wafer 100, thus, the conducting material 122 in each through via 121 is electrically connected to the back metal layer 151, as shown in FIG. 1E. Optionally, dopants may be heavily doped at the back surface of thinned wafer before the metal layer 151 is formed.

Figures 1, 1F:
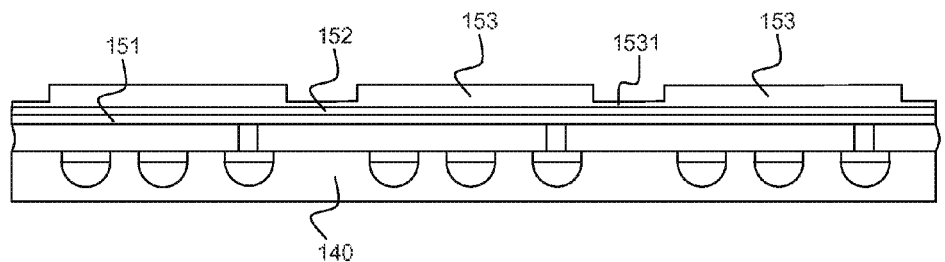
Figures 1, 1F, 2:
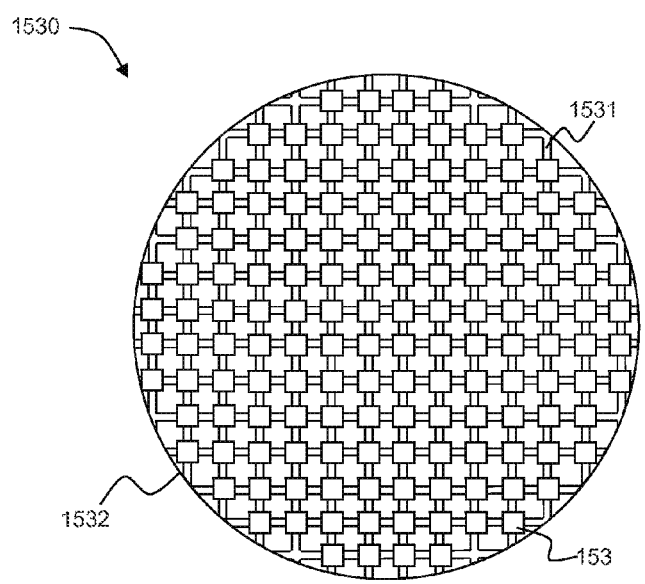
FIGS. 2A-2G are schematic diagrams illustrating another method of preparing a wafer level package device with the thick bottom metal in according to an alternative embodiment of the present invention.
Figures 1, 1F, 2, 3:
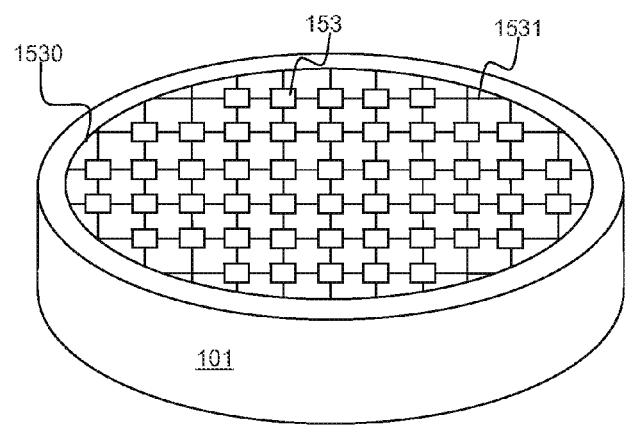
FIGS. 3A-3D are schematic diagrams illustrating the steps of forming through vias in the wafer after thinning the wafer.
Figures 1, 1F, 2, 3, 4:
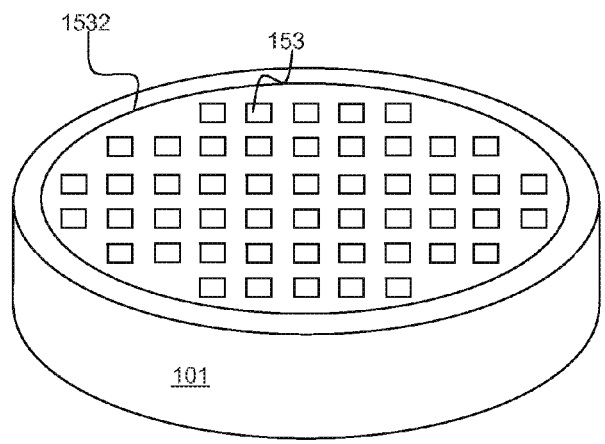
FIGS. 4A-4E are schematic diagram illustrating the steps of forming a cutting groove at the front surface of the wafer, filling the groove with a package material, then forming the through vias at the back surface of the thinned wafer followed by depositing a metal layer on the back surface of the thinned wafer.
Figures 1, 1F, 2, 3, 4, 5:
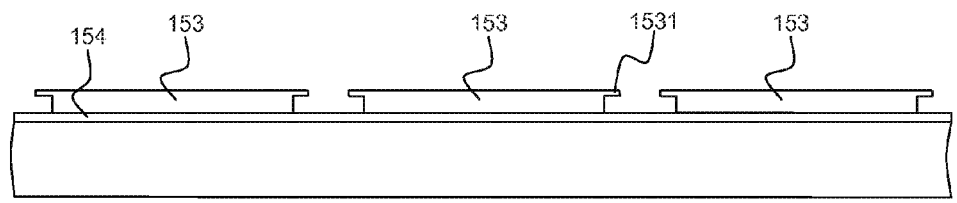
FIGS. 5A-5E are schematic diagrams illustrating a method of preparing a wafer level package device without a bonding pad on the front surface of the chip and the though via filled with a conductive material for electrically connecting the bonding pad to an electrode in the back surface of the chip.
Figures 1, 1F, 2, 3, 4, 5, 6:
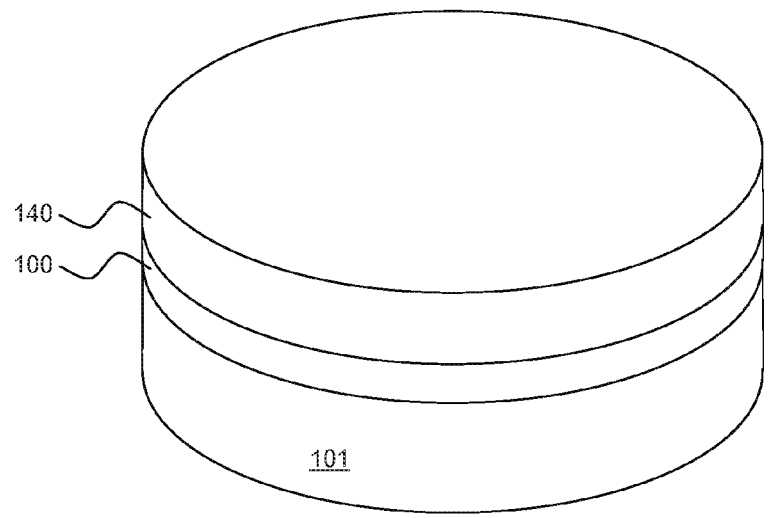
FIGS. 6A-6D are schematic diagrams illustrating another method of preparing the wafer level package device without a bonding pad on the front surface of the chip and the though via filled with a conductive material for electrically connecting the bonding pad to an electrode in the back surface of the chip.
Figure 1G:
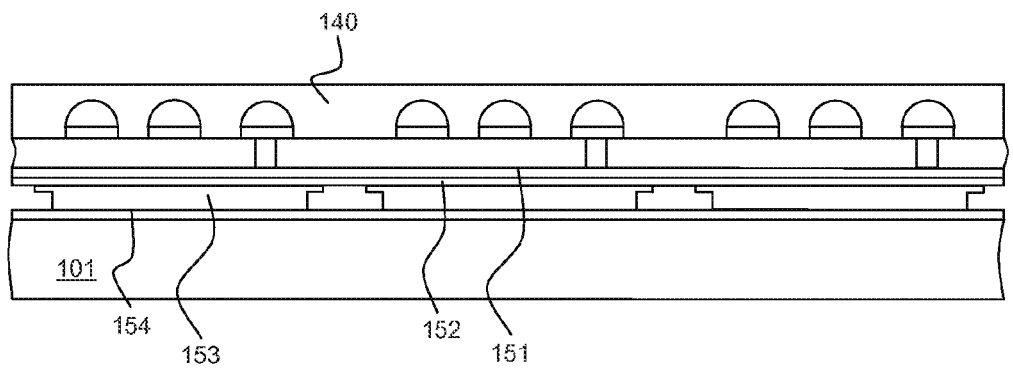

As shown in FIG. 1F-2, a lead frame 1530 includes a plurality of thick bottom metals 153 arranged in a matrix structure and connected to each other through connecting bands 1531, in which the thick bottom metals 153 close to the periphery of the lead frame 1530 is connected to a metal ring 1532 through the connecting bands 1531. As shown in FIG. 1F-1, the lead frame 1530 is attached on the back metal layer 151 at the back surface of the thinned wafer, e.g., by a bonding material 152 coating on the back metal layer 151 with each thick bottom metal 153 aligned to a central portion of each chip. To achieve a maximum yield, the number of the thick bottom metals 153 is consistent with the number of the complete chips on the wafer 100 and preferably the lead frame 1530 has a same size and dimension to the wafer 100.

FIGS. 1F-3-FIG. 1F-6 illustrate an example of a method of attaching the thick bottom metal 153 on the back metal layer 151. As shown in the figures, the lead frame 1530 is attached on the front surface of a carrier wafer 101 through an adhesive layer 154, such as a double side adhesive film. As shown in FIG. 1F-4, the connecting bands 1531 and the metal ring 1532 in the lead frame 1530 are then cut off. FIG. 1F-5 is a cross-sectional schematic diagram illustrating the bottom metal 153 attached on the carrier wafer 101 after the connecting bands 1531 are cut off.

As shown in FIG. 1F-6 and FIG. 1G, the back metal layer 151 at the back surface of the thinned wafer 100 (shown in FIG. 1E) is attached to the lead frame on the front surface of the carrier wafer 101 by a conductive adhesive layer 152 coated on the back metal layer 151, such that each thick bottom metal 153 is aligned with and attached on the back surface of each chip formed in the wafer 100. Then, the adhesive layer 154 and the carrier wafer 101 are removed. The adhesive layer 154 can be a thermal release film or a release film easily peeled off under exposure to ultraviolet radiation and the likes.

Figure 1H:
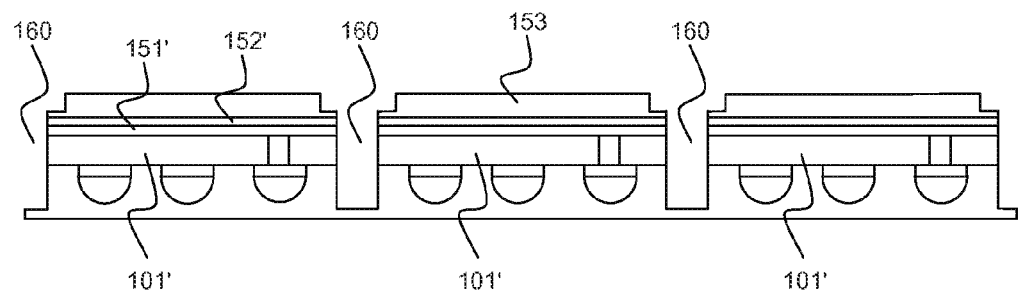

As shown in FIG. 1H, a back side cutting groove 160 is formed from the back surface of the thinned wafer 100 in a space between two adjacent chips aligned to the scribed lines on the wafer front face, which penetrates through the conductive adhesive layer 152, the back metal layer 151 and the entire thickness of wafer 100 so that the individual chips 101' are separated. The groove 160 is extended and ended in the front package layer 140 such that a portion of the front package layer 140 forms a bottom of the groove 160. In particular, the back side cutting groove 160 is overlapped with a corresponding scribe line at the front surface of the wafer 100. In this step, the conductive adhesive layer 152 and the metal layer 151 are also cut off to form a plurality of conductive adhesive layers 152' and a plurality of back metal layer 151' respectively, each of which covers the back surface of each chip 101' with one thick bottom metal 153 attached thereon. At this stage, the plurality of chips 101' are still connected to each other through the package layer 140.

Figure 1I:
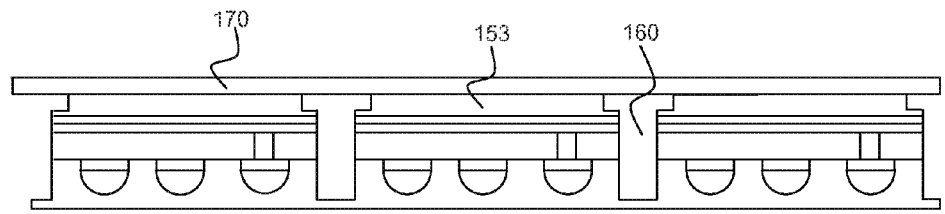
Figure 1J:
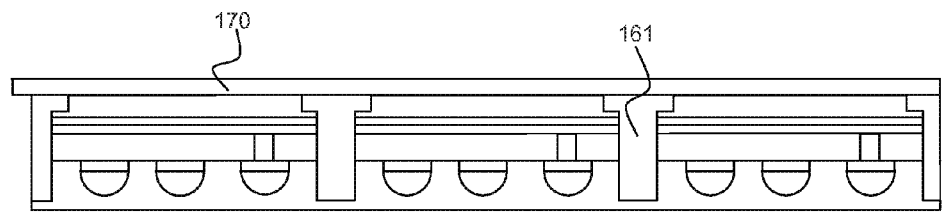
Figure 1K:
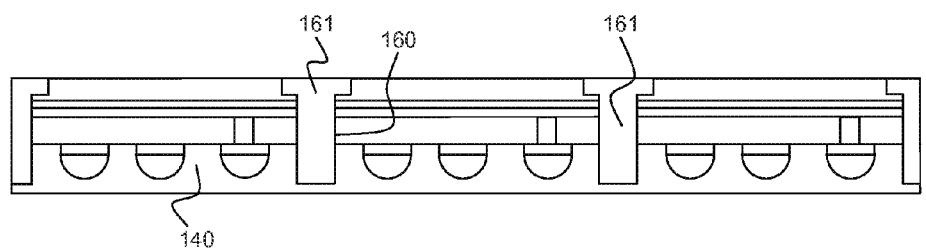
Figure 1L:
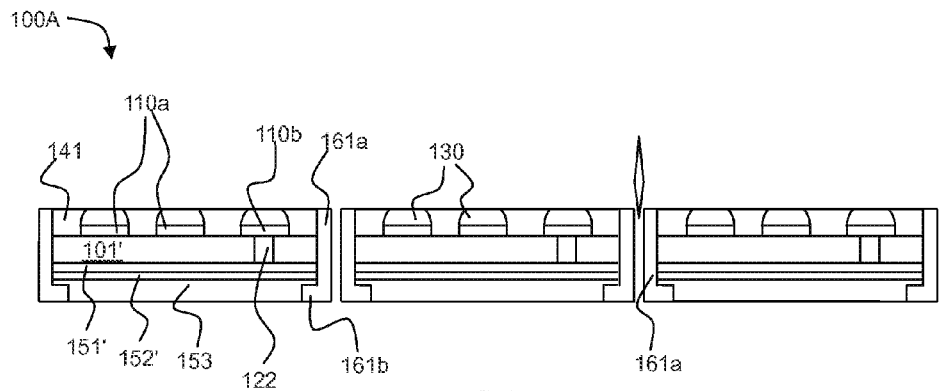

As shown in FIG. 1I, release film 170, which is expandable and high temperature resistance, is flatly placed inside of a top cavity wall of a package cavity (not shown), then the wafer 100 with the front package layer 140 and the thick bottom metal 153 (as shown in FIG. 1H) is placed inside the cavity such that the bottom surface of the thick bottom metal 153 is closely adhered to the film 170. Then, a package material 161 is filled into the back side cutting groove 160 and the space between adjacent thick bottom metals 153. The release film 170 can be removed after the package material 161 is solidified, as shown in FIGS. 1J-1K. And then, as shown in FIG. 1L, the front package layer 140 is ground until the metal interconnecting structure 130 exposes out from the thinned front package layer 140. In one preferred embodiment, the back side cutting groove 160 extending into the front package layer 140 to a depth beyond a height of the metal interconnecting structure 130 from the wafer front face. As a result, the thinned front package layer 140 is divided into a plurality of top package layers 141 separating by the package material 161 filled in the back side cutting grooves 160 with each top package layer 141 covering the front surface of each chip 101' with the top surface of the metal interconnecting structure 130 and the top surface of the top package layer 141 being co-planar.

As shown in FIG. 1L, a portion of the package material 161 is cut along the back side cutting groove 160 to obtain a plurality of wafer level package devices 100A, each of which includes a package body 161a covering and interfacing the sidewalls of the chip 101', the top package layer 141, the bottom metal layer 151', the conductive adhesive layer 152' and at least the sidewalls of the bottom metal 153. In a preferred embodiment, the surface area of the thick bottom metal 153 is less than the surface area of the chip 101', so that the package body 161a further includes a portion 161b that has a thicker width surrounding the bottom portion of the bottom metal 153 than the portion 161a surrounding the sidewalls of chip 101'. In one embodiment, the portion 161a further surrounds at least a portion of the sidewalls of the top package layer 141.

Figure 1M:
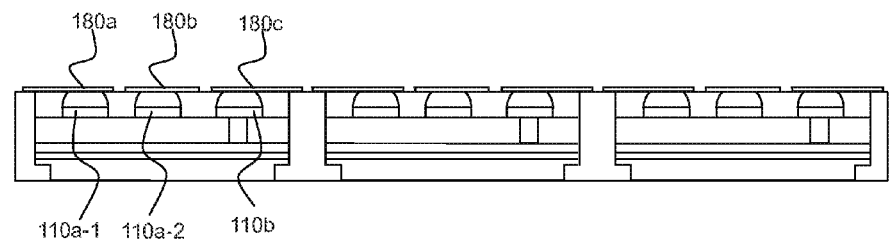
Figure 1N:
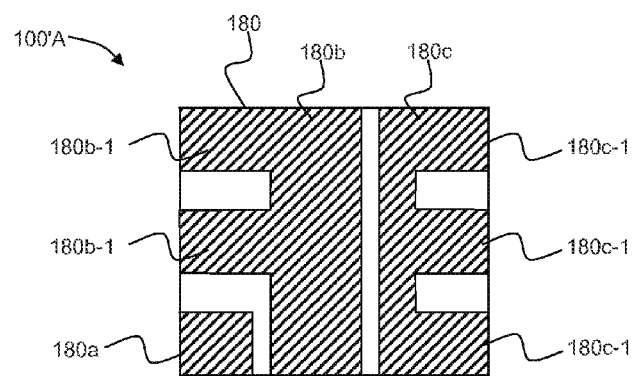
Figure 1O:
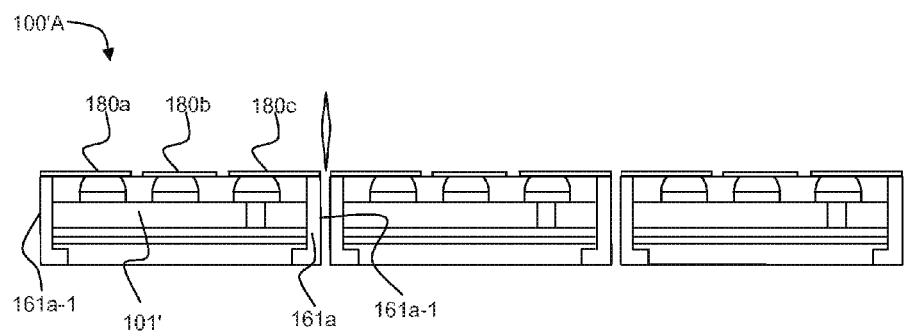

FIGS. 1M-1O show alternative steps for making another package device 100'A. Starting with the device structure shown in FIG. 1K, before cutting a portion of the package material 161, re-patterning the first bonding pads 110a-1 and 110a-2 and the second bonding pad 110b locations is carried out by depositing a patterned metal layer 180 on the top package layer 141, which includes a plurality of metal pads 180a, 180b and 180c, each of which is partially overlapped with the bonding pads 110a-1, 110a-2 and 110b and having an area larger than the corresponding metal connecting structure. For example, the metal pad 180a is partially overlapped with the first bonding pad 110a-1, the metal pads 180b is partially overlapped with the first bonding pad 110a-2, and the metal pad 180c is partially overlapped with the second bonding pad 110b. As such each bonding pad can be electrically connected with one corresponding metal pad through one metal interconnecting structure 130. For example, the first bonding pads 110a-1 and 110a-2 are electrically connected with the metal pads 180a and 180b through the metal interconnecting structure 130 respectively; and the second bonding pad 110b is electrically connected with the metal pad 180c through the metal interconnecting structure 130. In addition, metal pads 180b and 180c include pins 180b-1 and 180c-1 respectively which are extended to cover a portion of package material 161 as shown in FIG. 1M. As a result, after a portion of the package material 161 is cut off, each side surface 161a-1 of the package body 161a is aligned with the edge of the pin 180b-1 (or 180c-1) as shown in FIG. 1O.

As shown in FIG. 1M, the metal pads 180a and 180c formed on the top surface of the package layers 141 of two adjacent chips are two separate pieces. However, in an alternative embodiment, two metal pads 180a and 180c formed on the two adjacent top package layers 141 can be originally formed in a single metal piece and then are separated from another after cutting a portion of the package material 161 shown in FIG. 1O. In this embodiment, each sidewall surface 161a-1 of the package body 161a is automatically aligned with the edge of the pin 180b-1 after the cutting step. Obviously, the package device 100'A is compatible with the traditional QFN (Quad Flat No-lead) or DFN (Dual Flat No-lead) package and has better heat dissipation and electrical performance.

In one embodiment, the chip 101' may be a vertical power MOSFET (Metal-Oxide-Semiconductor Field Effect Transistor) device, in which, the first bonding pad 110a-1 is a gate electrode, and the first bonding pad 110a-2 is a source electrode, while the bottom metal layer 151' is a drain electrode. As shown in FIG. 1A, FIG. 1L and FIG. 1O, the chip 101' includes a through via 121 aligning with the second bonding pad 110b, penetrating through the thickness of the chip 101' and filled with a conductive material 122 that electrically connects the bottom metal layer 151' with the second bonding pad 110b. As a result, all three electrodes (source, gate and drain electrodes) are located at the top surface of the chip 101'. In an alternative embodiment, after the attachment of the lead frame 1530 to the thinned wafer as shown in FIG. 1F-2, the front package layer 140 is thinned to expose the metal interconnecting structures 130 followed by cutting the wafer into individual chips with or without the patterned metal layer 180. The device formed thus has the sidewalls of the chip exposed.

Figure 2A:
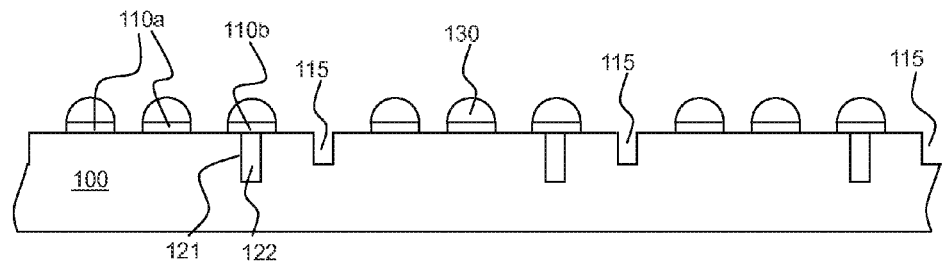

FIGS. 2A-2G are cross-sectional schematic diagrams illustrating another method of making a semiconductor package device. Similar as FIG. 1A, as shown in FIG. 2A, the wafer 100 includes a plurality of chips (not shown) separated from each other by a plurality of scribe lines (not shown) formed at the front surface of the wafer 100. The first bonding pads 110a and the second bonding pads 110b are formed at the front surface of each chip. Furthermore, a through via 121 is formed at the top portion of each chip, aligned under the second bonding pad 110b. A thin insulation layer (not shown) is formed to cover the sidewall and bottom of the through via, then the though via 121 is filled with a conductive material 122, thus the conductive material 122 is electrical isolated from the conductive material of the wafer surrounding the through via 121 and electrically connected to the second bonding pad 110b.

Figure 2B:
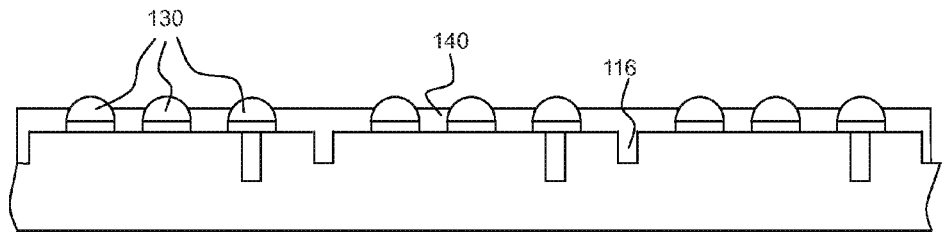
Figure 2C:
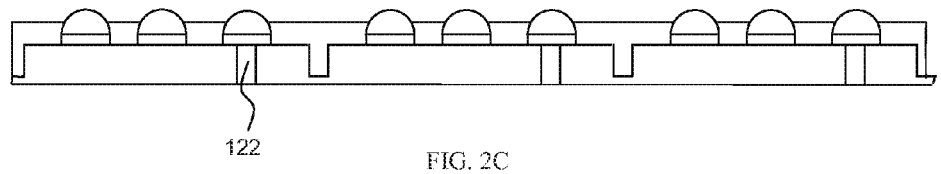

Then, one metal interconnecting structure 130 is formed on each of the bonding pads 110a and 110b, followed by the formation of front side cutting grooves 115 on the front surface of the wafer 100 by cutting along the scribe lines from the front surface of the wafer and extending into the wafer 100 to a predetermined depth, preferable shallower than a thickness of the chip after wafer thinning And then, as shown in FIG. 2B, the front package layer 140 is formed covering at the front surface of the wafer 100 and encapsulating the first and second bonding pads 110a and 110b and a bottom portion of the metal interconnecting structure 130 with the top end of the metal interconnecting structure protruding out of the upper surface of the front package layer 140. In this step, a package material 116 of the front package layer 140 is filled in the front side cutting groove 115. As shown in FIG. 2C, the back surface of the wafer 100 is ground to thin the wafer, and one back metal layer 151 is deposited to cover the back surface of the thinned wafer.

Figure 2D:
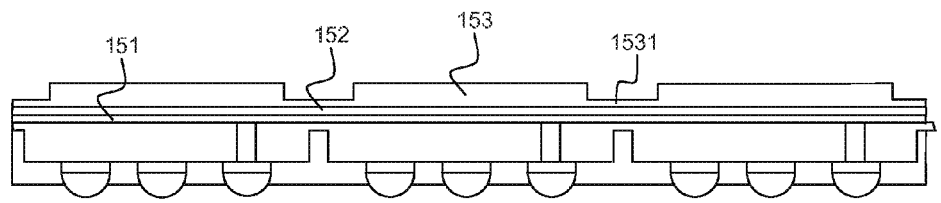
Figure 2E:
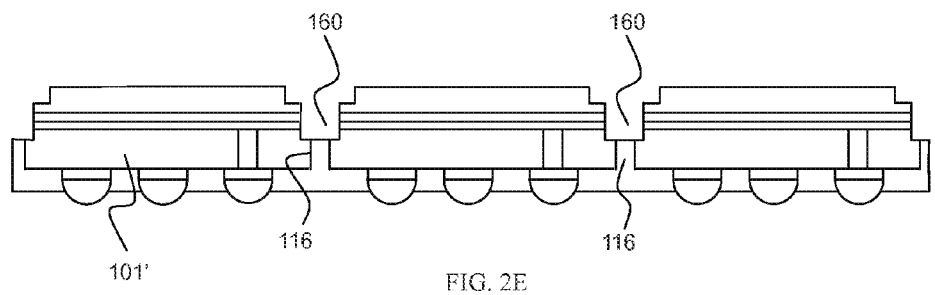

Similar to FIG. 1F-1, as shown in FIG. 2D, a lead frame 1530 including a plurality of thick bottom metals 153 arranged in a matrix structure and connected to each other through a connecting band 1531 with the thick bottom metals 153 close to the periphery of the lead frame 1530 connected to a metal ring 1532 through the connecting bands 1531 is attached on the back metal layer 151 at the back surface of the thinned wafer by a bonding material 152 coating on the back metal layer 151 with each thick bottom metal 153 aligned to a central portion of each chip. Furthermore, as shown in FIG. 2E, the plurality of back side cutting grooves 160 penetrating through the bonding material 152 and the metal layer 151 are formed at the back surface of the thinned wafer 100 with the bottom of the grooves 160 ending inside the thinned wafer 100. The back side cutting groove 160 is required to be aligned and overlapped with the front side cutting groove 115 and extending to a depth exposing the front package layer 140 such that a portion of the front package layer 140 forming a bottom of the back side cutting groove 160. As such, the adjacent chips 101' can be divided by the back side cutting grooves 160 and the front side cutting grooves 115. Thus, the bonding material 152 is cut off to form a plurality of conductive bonding layers 152' and the back metal layer 151 is cut off to form a plurality of back metal layer 151' each of which covers the back surface of each chip 101' and is attached with one thick bottom metal 153 through one conductive bonding layer 152'.

Figure 2F:
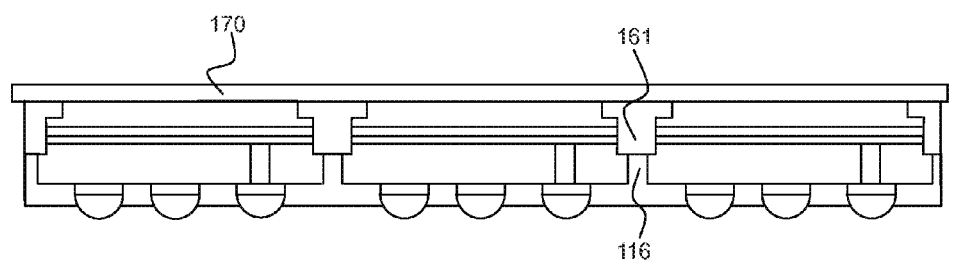
Figure 2G:
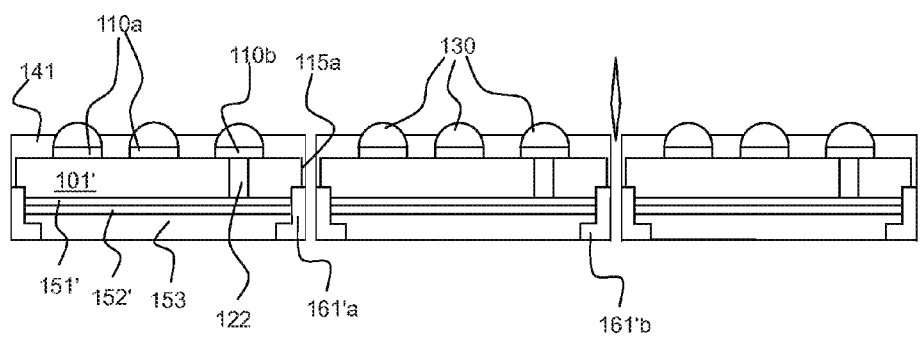

As shown in FIG. 2F, the package material 161 is filled into the back side cutting groove 160 and the space between the adjacent thick bottom metals 153, which can be done similar as described above in FIG. 1J, followed by the cutting portions of the package materials 161 and 116 filled in the back side cutting groove 160 and the front side cutting groove 115 respectively thus forming a first package body 161'a covering the sidewall surfaces of the bottom metal layer 151', the conductive bonding layer 152', the bottom metal 153 and a bottom portion of the chip 101' and a second package body 115a covering the sidewall surfaces of the top portion of the chip 101'. As a result, the front package layer 140 is cut into the plurality of top package layer 141, each of which covers the front surface of each chip 101' and extending over the edges of the chip covering a portion of the sidewall of the chip. If the surface area of the bottom metal 153 is less than the surface area of the chip 101', the first package body 161'a also includes a portion 161'b surrounding the bottom metal 153. The first package body 161'a and the second package body 115a cover the sidewalls of the chip 101', the back metal layer 151', the conductive bonding layer 152' and at least the sidewalls of the thick bottom metal 153. In a preferred embodiment, the portion of top package layer wrapping the top portion of the semiconductor chip sidewall is thinner than the portion of the package body surrounding the bottom portion of the semiconductor chip sidewall.

In an alternative embodiment, the step of forming front side cutting grooves 115 on the front surface of the wafer 100 along the scribe lines as shown in FIG. 2A is omitted, after the attachment of the lead frame 1530 to the thinned wafer as shown in FIG. 2D, the wafer is cut into individual chips without the steps of forming back side grooves and applying the package material 161. The device formed thus has the sidewalls of the chip exposed.

The through via 121 and the bonding pad 110b as shown in FIG. 1A can be formed as follows. Firstly, the through via 121 is formed at the front surface of each chip of the wafer 100 with the depth of the through via being less than the thickness of the wafer. Then, an insulation layer is deposited at the side wall and the bottom of the through via 121 followed by filling the conducting material 122 in the through via 121. The second bonding pad 110b is formed and partly overlapped with the through via 121 at the front surface of the chip, as such, the second bonding pad 110b is electrically connected with the conducting material 122 in the through via 121.

Figure 3A:
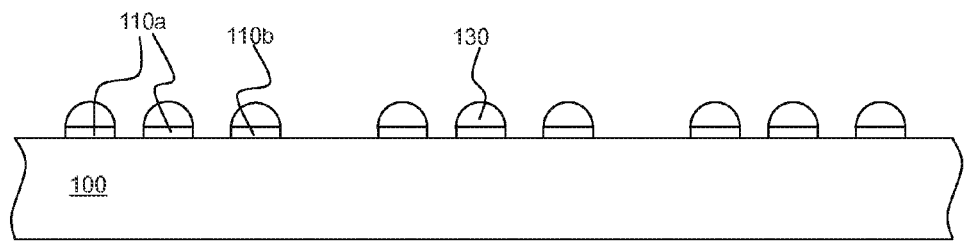
Figure 3B:
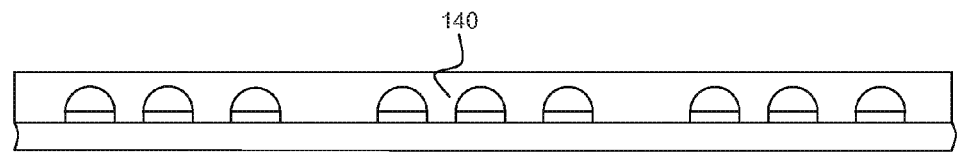
Figure 3C:
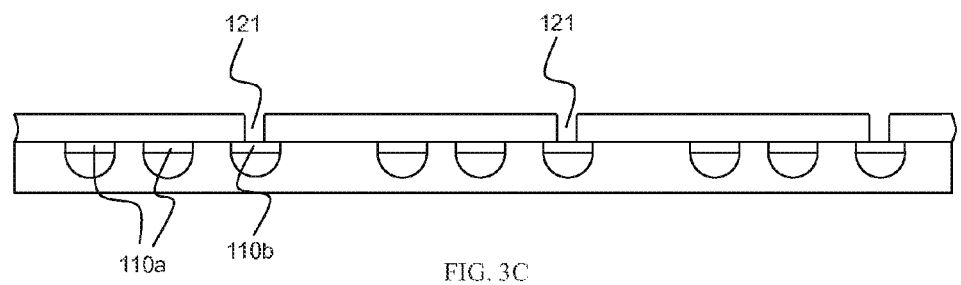
Figure 3D:
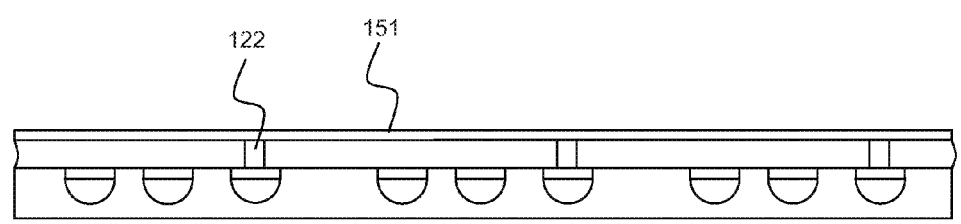

FIGS. 3A-3D illustrate a different way of forming the through via 121 in the package device structure comparing with FIGS. 1A-1D, in which the through via 121 is not formed in the wafer 100 in the starting stage. As shown in FIG. 3A, a wafer 100 comprises a plurality of chips (not shown) separated from each other by a plurality of scribe lines (not shown) formed at the front surface of the wafer 100. The first bonding pads 110a and the second bonding pads 110b are formed at the front surface of each chip and a metal interconnecting structure 130 is formed on each of the bonding pads 110a and 110b. As shown in FIG. 3B, a front package layer 140 is deposited to cover the front surface of the wafer 100 and encapsulate the first and second bonding pads 110a, 110b and the metal interconnecting structures 130. As shown in FIG. 3C, the wafer 100 is thinned from its back surface followed by forming the through via 121 from the back surface of the thinned wafer, which is aligned and overlapped with the second bonding pad 110b in each chip of the wafer 100. As shown in FIG. 3D, an insulation layer (not shown) is deposited at the side wall of the through via 121, then the conducting material 122 is filled in the through via 121 followed by depositing the back metal layer 151 at the back surface of the thinned wafer.

Figure 4A:
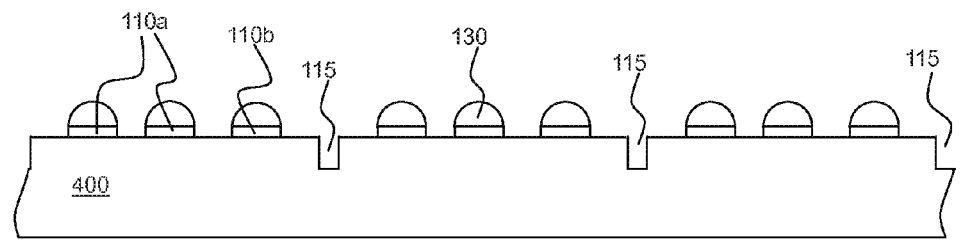
Figure 4B:
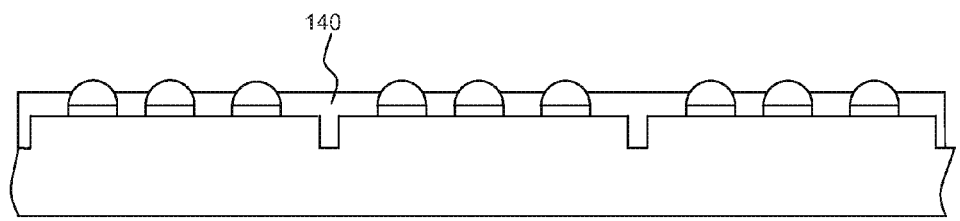
Figure 4C:
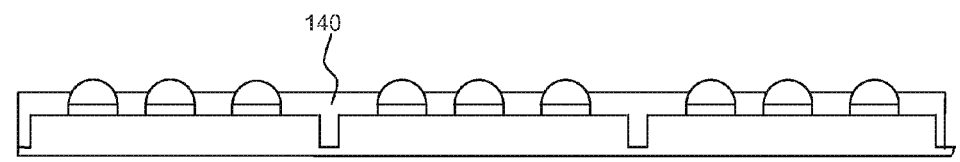
Figure 4D:
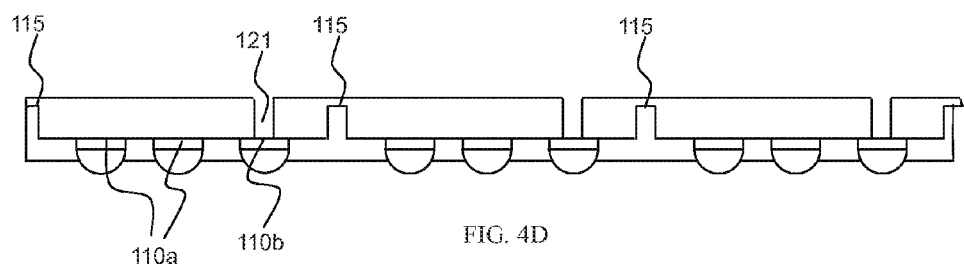
Figure 4E:
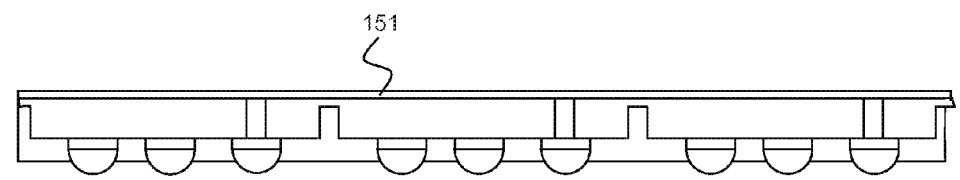

FIGS. 4A-4E illustrate a different way of forming the through via 121 in the package device structure comparing with FIGS. 2A-2C, in which the through via 121 is not formed in the wafer 100 in the starting stage. As shown in FIG. 4A, the wafer 100 includes a plurality of chips (not shown) separated from each other by a plurality of scribe lines (not shown) formed at the front surface of the wafer 100. The first bonding pads 110a and the second bonding pads 110b are formed at the front surface of each chip. One metal interconnecting structure 130 is formed on each of the bonding pads 110a and 110b, followed by the formation of the front side cutting grooves 115 on the front surface of the wafer 100 by cutting along the scribe lines from the front surface of the wafer and extending to into the wafer 100. And then, as shown in FIG. 4B, the front package layer 140 is formed covering at the front surface of the wafer 100, encapsulating the first and second bonding pads 110a and 110b and a bottom portion of the metal interconnecting structure 130 with the top end of the metal interconnecting structure protruding out of the upper surface of the package layer 140 and filling the front side cutting grooves 115. As shown in FIG. 4C, the back surface of the wafer 100 is ground to thin the wafer. The through via 121 is then formed by drilling or etching from the back surface of thinned wafer, which is aligned and overlapped with the second bonding pad 110b in each chip of the wafer 100. One insulation layer (not shown) is then deposited at the side wall of the through via 121 followed by filling the conducting material 122 in the through via 121 and depositing the back metal layer 151 at the back surface of the thinned wafer as shown in FIG. 4E.

Figure 5A:
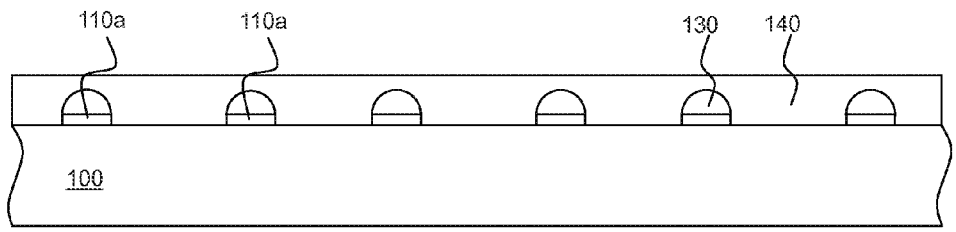
Figure 5B:
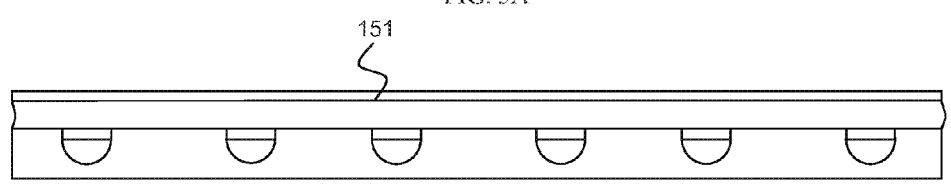
Figure 5C:
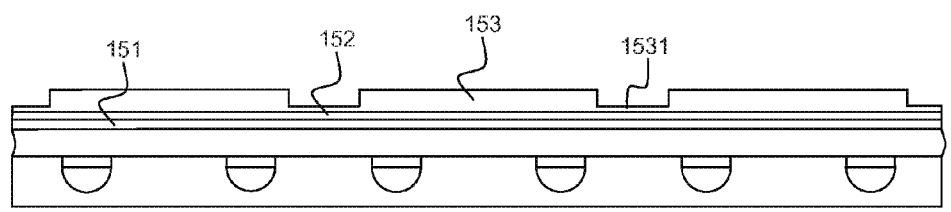
Figure 5D:
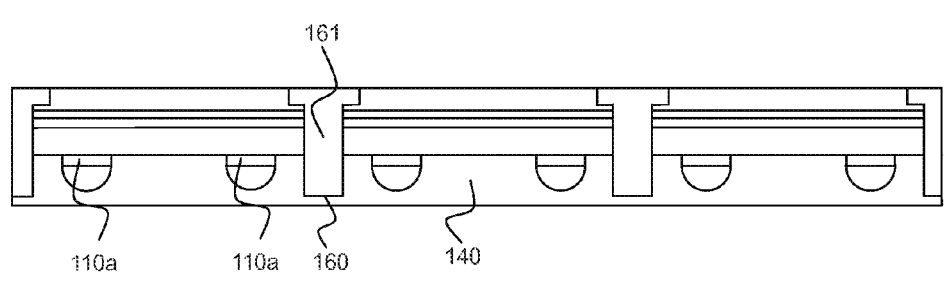
Figure 5E:
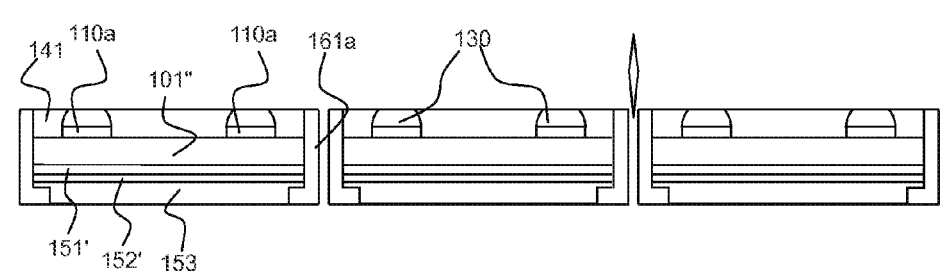

FIGS. 5A-5E illustrate a method of manufacturing an alternative package device, in which the electrode at the back surface of the chip is not brought to its front surface through the conductive material filled in a through via as described in FIGS. 1A-1O. As shown in FIG. 5A, the wafer 100 comprises a plurality of chips (not shown) separated from each other by a plurality of scribe lines (not shown) formed at the front surface of the wafer 100. The first bonding pads 110a are formed at the front surface of each chip. A metal interconnecting structure 130 is formed on each of the bonding pads 110a. A front package layer 140 is deposited to cover the front surface of the wafer 100 and encapsulate the first bonding pads 110a and the metal interconnecting structures 130. The wafer 100 is then ground from its back surface, as shown in FIG. 5B and a back metal layer 151 is deposited to cover the back surface of the thinned wafer 100. As shown in FIG. 5C, thick bottom metals 153 arranged in a matrix structure and connected to each other through a connecting band 1531 are attached on the back metal layer 151 at the back surface of the thinned wafer by a bonding material 152 coating on the back metal layer 151 with each thick bottom metal 153 aligned to a central portion of each chip. As shown in FIG. 5D, a back side cutting groove 160 is formed from the back surface of the thinned wafer 100 in a space between two adjacent chips, which penetrates through the conductive adhesive layer 152, the metal layer 151 and the wafer 100. The groove 160 is ended inside the package layer 140. In particular, the back side cutting groove 160 is overlapped with a corresponding scribe line at the front surface of the wafer 100. In this step, the conductive adhesive layer 152 and the metal layer 151 are also cut off to form a plurality of conductive adhesive layers 152' and a plurality of back metal layer 151' respectively, each of which covers the back surface of each chip 101' with one thick bottom metal 153 attached thereon. At this stage, the plurality of chips 101' are still connected to each other through the un-cut portion of the front package layer 140. The package material 161 is then filled in the back side cutting groove 160 and the space between the adjacent thick bottom metals 153. And then, as shown in FIG. 5E, the package layer 140 is ground until the metal interconnecting structure 130 exposes out from the thinned package layer 140. As a result, the thinned package layer 140 are cut into a plurality of top package layers 141 with each top package layer 141 covering the front surface of each chip 101' and the top surface of the metal interconnecting structure 130 and the top surface of the top package layer 141 are co-planar. As shown in FIG. 5E, individual wafer level package devices are separated by cutting a portion of the package material 161 along the back side cutting groove 160. When the re-patterning of the bonding pad location is carried out, similar as described above in FIGS. 1M-1O, the metal pads only formed on the first bonding pad 110a. In an alternative embodiment, after the attachment of the lead frame 1530 to the thinned wafer as shown in FIG. 5C, the front package layer 140 is thinned to expose the metal interconnecting structures 130 followed by cutting the wafer into individual chips with or without the patterned metal layer 180. The device formed thus has the sidewalls of the chip exposed.

Figure 6A:
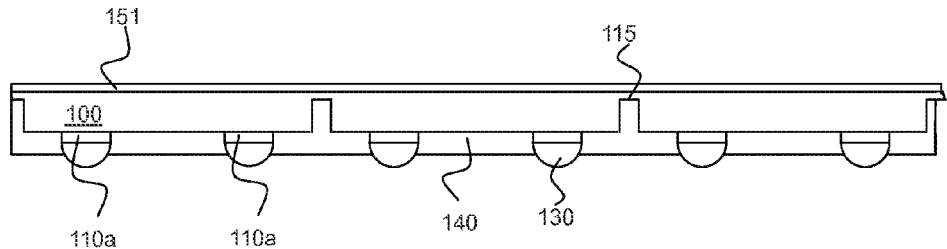
Figure 6B:
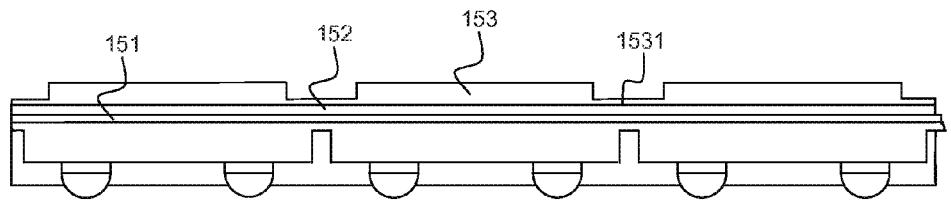
Figure 6C:
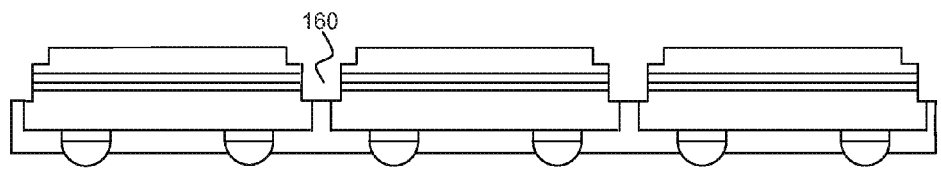
Figure 6D:
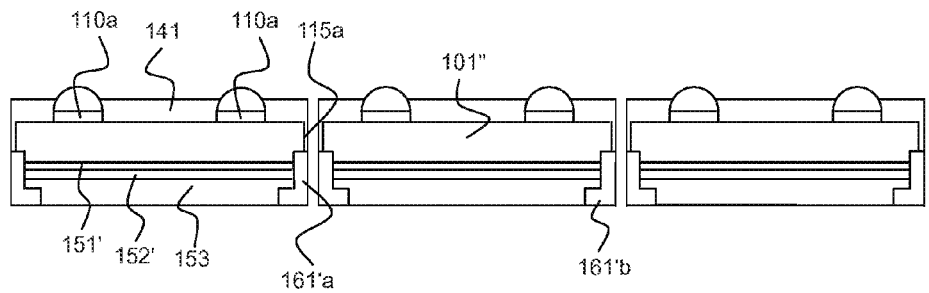

FIGS. 6A-6D illustrates another method of making a semiconductor package device similar as the method described in FIGS. 2A-2G excepting that the electrode at the back surface of the chip is not brought to its front surface through the conductive material filled in a through via. As shown in FIG. 6A, the wafer 100 includes a plurality of chips (not shown)

separated from each other by a plurality of scribe lines (not shown) formed at the front surface of the wafer 100. The first bonding pads 110a are formed at the front surface of each chip. The metal interconnecting structure 130 is formed on each of the bonding pads 110a followed by the formation of the front side cutting grooves 115 on the front surface of the wafer 100 by cutting along the scribe lines from the front surface of the wafer and extending to into the wafer 100. The front package layer 140 is formed covering at the front surface of the wafer 100, encapsulating the first bonding pads 110a and a bottom portion of the metal interconnecting structure 130 with the top end of the metal interconnecting structure protruding out of the upper surface of the front package layer 140 and filling in the cutting groove 115. The back surface of the wafer 100 is ground to thin the wafer, and one back metal layer 151 is deposited to cover the back surface of the thinned wafer. As shown in FIG. 6B, thick bottom metals 153 arranged in a matrix structure and connected to each other through a connecting band 1531 are attached on the metal layer 151 at the back surface of the thinned wafer by a bonding material 152 coating on the metal layer 151 with each bottom metal 153 aligned to a central portion of each chip. Furthermore, as shown in FIG. 6C, the plurality of back side cutting grooves 160 penetrating through the bonding material 152 and the back metal layer 151 are formed at the back surface of the thinned wafer 100 with the bottom of the grooves 160 ending inside the thinned wafer 100. The back side cutting groove 160 is required to be aligned and overlapped with the front side cutting groove 115. As such, the adjacent chips 101" can be separated by the back side cutting grooves 160 and the front side cutting grooves 115, thus the bonding material 152 is cut off to form a plurality of conductive bonding layers 152' and the back metal layer 151 is cut off to form a plurality of back metal layer 151' each of which covers at the back surface of each chip 101" and is attached with one thick bottom metal 153 through one conductive bonding layer 152'. As shown in FIG. 6D, the package material 161 is filled in the back side cutting groove 160 and the space between the adjacent thick bottom metals 153, followed by the cutting portions of the package materials 161 and 116 filled in the back side cutting groove 160 and the front side cutting groove 115 respectively forming a first package body 161'a covering the side surfaces of the bottom metal layer 151', the conductive bonding layer 152', the bottom metal 153 and a bottom portion of the chip 101" and the second package body 115a covering the side surface of a top portion of the chip 101" respectively. As a result, the package layer 140 is cut into the plurality of top package layer 141, each of which covers the front surface of each chip 101". In a preferred embodiment, the portion of top package layer wrapping the top portion of the semiconductor chip sidewall is thinner than the portion of the package body surrounding the bottom portion of the semiconductor chip sidewall. In another preferred embodiment, the chip 101" may be a common-drain double-MOSFET device.

Alternatively, the chip 101" can be a lateral type device, as such the step of forming the back metal layer 151' is omitted. However, it is preferable to form the back metal layer 151' for attaching the thick bottom metal 153 onto the back metal layer 151' from the back surface of the chip 101" that is made of silicon. In an alternative embodiment, the step of forming front side cutting grooves 115 on the front surface of the wafer 100 along the scribe lines as shown in FIG. 6A is omitted, after the attachment of the lead frame 1530 to the thinned wafer as shown in FIG. 6B, the wafer is cut into individual chips without the steps of forming back side grooves and applying the package material 161. The device formed thus has the sidewalls of the chip exposed.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A method for manufacturing a wafer level chip scale (WLCS) package device with a thick bottom metal comprising:
    providing a semiconductor wafer including a plurality of semiconductor chips having a plurality of bonding pads formed on a front surface of each chip and a plurality of scribe lines to separate the semiconductor chips;
    attaching a metal interconnecting structure on each bonding pad;
    forming a top package layer covering a front surface of the semiconductor wafer and surrounding each metal interconnecting structure;
    thinning from a back surface opposite the front surface of the semiconductor wafer to thin the wafer and depositing a back metal layer to cover the back surface of the thinned wafer;
    attaching a lead frame comprising a plurality of thick bottom metals onto the back metal layer, wherein each thick bottom metal is aligned to a central portion of each chip, a plurality of connecting bands thinner than the thick bottom metal interconnecting the thick bottom metals constituting the lead frame;
    forming a plurality of back side cutting grooves along the scribe lines penetrating through the connecting bands, the back metal layer and into the wafer to a depth such that at least a portion of the top package layer forms a bottom of the back side cutting grooves;
    filling the back side cutting grooves and a space between the adjacent thick bottom metals with a package material; and
    cutting through the package material along the back side cutting grooves and the top package layer along the portion of the top package layer forming the bottom of the back side cutting grooves thus forming a plurality of singulated WLCS package devices.

2. The method of claim 1, wherein the step of forming the top package layer covering the front surface of the semiconductor wafer and surrounding each metal interconnecting structure further comprises forming the top package layer to cover each metal interconnecting structure entirely.

3. The method of claim 2 further comprising a step of thinning the top package layer covering the front surface of the semiconductor wafer to expose a top surface of the metal interconnecting structures, wherein a top surface of the top package layer being coplanar to the top surface of the metal interconnecting structures after the step of filling the back side cutting grooves and the space between the adjacent thick bottom metals with the package material.

4. The method of claim 3 further comprising a step of forming a plurality of metal pads by forming a patterned metal layer on the top surface of the top package layer, wherein each metal pad is electrically connected to one corresponding bonding pad through at least one of the metal interconnecting structures, each metal pad extending over an area larger than an area of the corresponding metal interconnecting structures.

5. The method of claim 1, wherein the step of forming the back side cutting grooves comprises cutting through an entire thickness of the thinned wafer.

6. The method of claim 1 further comprising a step of forming a plurality of front side cutting grooves along the scribe lines into the wafer to a predetermined depth before the step of forming the top package layer covering the front surface of the semiconductor wafer, wherein the step of forming the top package layer further comprising a step of filling the front side cutting grooves with the top package layer.

7. The method of claim 1, wherein the plurality of bonding pads comprise a first bonding pad and a second bonding pad and each of the semiconductor chips further comprises a conductive via aligning with the second bonding pad filled with a conductive material, and the step of thinning the semiconductor wafer further removes a portion of the wafer from the back surface to expose the conductive material filling the conducive via.

8. The method of claim 1, further comprising a step of forming a through via aligned to one of the bonding pads on each semiconductor chip after the step of thinning the wafer, and the step of depositing the back metal layer on the back surface of the thinned wafer further comprising a step of filling the via with a conductive material such that after the deposition of the back metal layer, the bonding pad is aligned to the through via electrically connecting to the back metal layer.

9. The method of claim 1, wherein a top surface of the metal interconnecting structures extends above a top surface of the top package layer.

10. The method of claim 9 further comprising a step of forming a plurality of front side cutting grooves along the scribe lines into the wafer to a predetermined depth before the step of forming the top package layer covering the front surface of the semiconductor wafer, wherein the step of forming the top package layer further comprising a step of filling the front side cutting grooves with the top package layer.

11. The method of claim 10, wherein the step of forming the plurality of back side cutting grooves along the scribe lines cutting into the wafer to a bottom portion of the front side cutting grooves.

12. The method of claim 1, wherein the lead frame comprising the plurality of thick bottom metals has a dimension substantially the same as the wafer.

13. The method of claim 1, wherein the step of attaching the lead frame comprising the plurality of thick bottom metals onto the back metal layer further comprising:
   providing a carrier wafer;
   attaching the lead frame on a front surface of the carrier wafer by an adhesive layer;
   attaching the back metal layer at the back surface of the thinned wafer on the lead frame at the front surface of the carrier wafer by a conductive bonding material coated on the metal layer, wherein each bottom metal is aligned to the central portion of each chip; and
   removing the adhesive layer and the carrier wafer.

* * * * *